United States Patent [19]
Gross

[11] Patent Number: 5,316,964
[45] Date of Patent: May 31, 1994

[54] METHOD OF FORMING INTEGRATED CIRCUITS WITH DIFFUSED RESISTORS IN ISOLATION REGIONS

[75] Inventor: William H. Gross, Santa Clara County, Calif.

[73] Assignee: Linear Technology Corporation, Milpitas, Calif.

[21] Appl. No.: 988,342

[22] Filed: Dec. 8, 1992

Related U.S. Application Data

[63] Continuation of Ser. No. 708,173, May 31, 1991, abandoned.

[51] Int. Cl.⁵ .............................................. H01L 21/70
[52] U.S. Cl. .................................... 437/60; 437/918; 148/DIG. 136
[58] Field of Search ............... 357/41, 43, 51, 47, 357/48; 437/918, 59, 60, 74, 75, 76; 148/DIG. 136

[56] References Cited

U.S. PATENT DOCUMENTS

| | | | |
|---|---|---|---|
| 3,488,564 | 1/1970 | Crafts | 357/48 |
| 3,990,092 | 11/1976 | Yoshimura | 357/51 |
| 4,039,857 | 8/1977 | Ahmed | 357/51 |
| 4,734,382 | 3/1988 | Krishna | 357/43 |
| 4,903,093 | 2/1990 | Ide et al. | 357/51 |
| 4,996,512 | 2/1991 | Byrkett | 357/51 |
| 4,996,569 | 2/1991 | Kaiser | 357/51 |
| 5,023,690 | 6/1991 | Verret et al. | 357/43 |
| 5,027,183 | 6/1991 | Dreps | 357/51 |
| 5,066,602 | 11/1991 | Takemoto et al. | 437/918 |

FOREIGN PATENT DOCUMENTS 62-154757  7/1987  Japan .

Primary Examiner—Tom Thomas
Assistant Examiner—Tuan Nguyen
Attorney, Agent, or Firm—Flehr, Hohbach, Test, Albritton & Herbert

[57] ABSTRACT

An integrated circuit having diffused resistors formed in a low impurity concentration isolation region.

9 Claims, 1 Drawing Sheet

METHOD OF FORMING INTEGRATED CIRCUITS WITH DIFFUSED RESISTORS IN ISOLATION REGIONS This is a continuation of application Ser. No. 07/708,173, filed on May 31, 1991, now abandoned.

BRIEF DESCRIPTION OF THE INVENTION

This invention relates generally to integrated circuits and more particularly to integrated circuits having diffused resistors in the isolation regions.

BACKGROUND OF THE INVENTION

A conventional integrated circuit including a diffused resistor in an isolated region is shown in FIG. 1. The transistor 11 is an NPN transistor formed in a first N-type isolated region 12 and a P-type resistor formed in an adjacent N-type isolated region 13 biased to high positive voltage such as $V_{cc}$. Another area where a resistor could be formed is in the isolation region. This would have the advantage that the isolation region is already biased to the proper voltage and that less area would be required. However, in conventional integrated circuits, the isolation region is heavily doped P-type material which isolates lightly doped N-regions. The normal resistors are made with a P-type diffusion into the epitaxially doped N-type epitaxial region. The only kind of resistor that can be made in the P-type isolation region is a heavily doped N-type resistor. The problem is that such a resistor will have a very low sheet resistance and a very low breakdown voltage.

OBJECTS AND SUMMARY OF THE INVENTION

It is an object of this invention to provide an integrated circuit in which resistors are formed by diffusing opposite polarity dopants into lightly doped isolation regions.

It is another object of the invention to provide resistors which are isolated from one another and have high breakdown voltages while using a minimum amount of area.

The foregoing and other objects of the invention are achieved by an integrated circuit including a layer of one conductive type, a region of opposite conductivity type extending through said layer to form isolated areas of said one conductivity type with said isolation region including lightly doped surface region and an inset region of said one conductivity type into said lightly doped isolation region to form a resistor.

BRIEF DESCRIPTION OF THE DRAWINGS

The foregoing and other objects of the invention will be more clearly understood from the description to follow when read in conjunction with the accompanying drawings of which.

DESCRIPTION OF PREFERRED EMBODIMENTS

Figure 1:
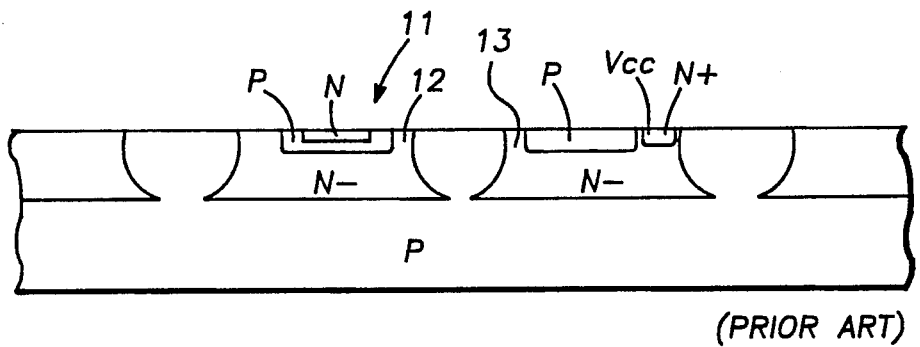
FIG. 1 is a representation of a prior art integrated circuit.

In FIG. 1, there is shown an integrated circuit in which the diffused resistor is formed in the isolated region 13. In such a circuit, additional area is required in view of the fact that the formation of the resistor requires an isolated region and an oppositely doped biasing region, $V_{cc}$.

In accordance with this invention, the resistor for the integrated circuit is formed in a lightly doped isolation region of the semiconductor device.

Figure 2:
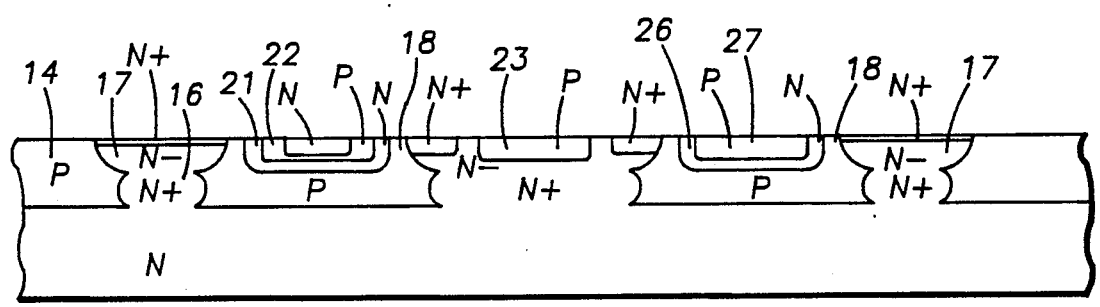
FIG. 2 shows an integrated circuit incorporating the present invention with P-type isolated regions formed on an N-type substrate.

Referring particularly to FIG. 2, there is shown a semiconductor device which, as formed, includes an N-type substrate into which high impurity N+ areas are diffused prior to the formation of a P type epitaxial region 14. Thereafter, an out-diffusion causes the formation of a buried N+ layer 16. Following out-diffusion of the N+ layer, an N— diffusion step is carried out in which an N— diffusion region 17 is diffused downwardly into the N+ region to form, together with the out-diffusion, an N-type isolation region defining P-type isolated regions 18. The same down diffusion step also forms the N-type collector region 21 of a transistor in the isolated region.

The next step in the process is to diffuse the P-type region into the N-type collector region 21 to form the base 22 of the transistor and into the N-type isolation region to form a P-type diffused resistor 23. In the same N-type isolation diffusion step, a base 26 can be formed in another isolation region and the P-type diffusion forms the emitter 27.

The resistor 23 is fully isolated from the adjacent regions and if more than one resistor is formed in the isolation region, the resistors are isolated from one another. The resistors have high breakdown voltage. Since they are formed in the isolation region, the surface area used is minimized. In the parts of the isolation region 24 where no resistors are needed, a heavily doped N-type diffusion region is formed to increase the isolation. It is noted that the diffusion steps not only serve form the isolation regions and resistors, but also regions of NPN and PNP transistors in the same diffusion step.

Figure 3:
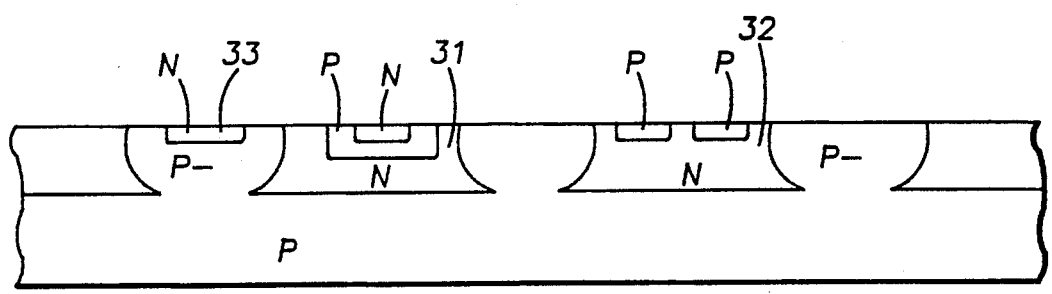
FIG. 3 shows an integrated circuit in accordance with this invention incorporating N-type isolated regions formed on a P-type substrate.
Figure 1:
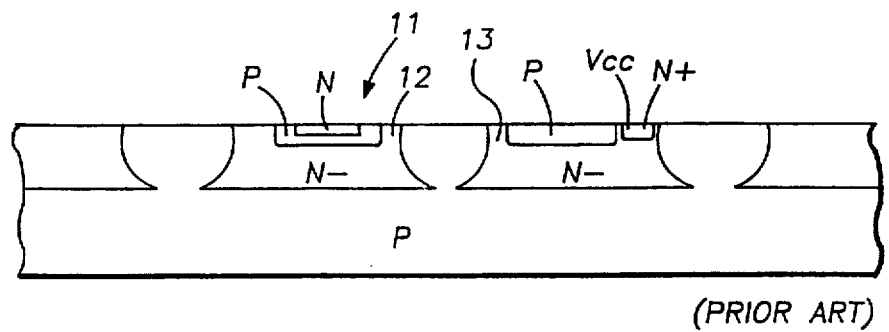
Figure 2:
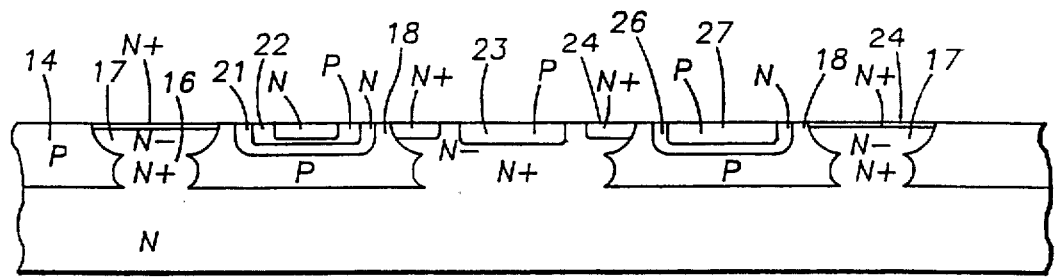
Figure 3:
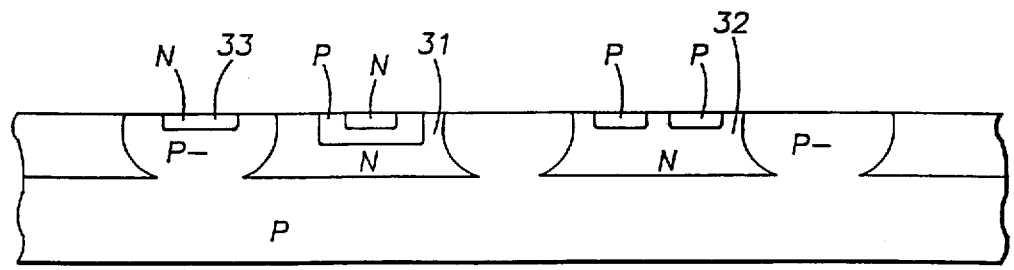

In FIG. 3, there is shown a integrated circuit which includes a P-type substrate. An epitaxial N-type layer is grown on the P-type substrate and thereafter, P— isolation regions are diffused into the device to form isolated regions 31 and 32. An N-type resistor 33 is formed in the isolation regions while NPN and PNP transistors are formed in the isolated regions 31 and 32.

Thus, there have been provided high breakdown voltage resistors with a wide range of resistance formed in lightly doped isolation regions of an integrated circuit. The back bias $V_{bb}$ for the resistors is automatically generated by the voltage applied to the isolation regions for isolation, and a minimum area is required for the resistors.

What is claimed is:

1. A method of forming a semiconductor device having a diffused resistor, said method comprising the steps of:
   a) epitaxially growing at least one semiconductor region of one conductivity type on a substrate of opposite conductivity type;
   b) diffusing dopants of said opposite conductivity type into said epitaxially grown semiconductor layer so as to form a lightly doped surface isolation region in which is formed at least one diffused resistor, said isolation region being formed so as to extend through said epitaxial layer to isolate areas of said one conductivity type; and c) diffusing dopants of said one conductivity type into said lightly doped surface region of said isolation region to form said at least one diffused resistor.

2. The method of claim 1 further including the step of forming a buried, heavily doped region beneath said lightly doped surface region of said isolation region.

3. The method of claim 2 further including the step of forming a highly doped surface region of said one conductivity type within said lightly doped surface region of said isolation region, said highly doped surface region being formed so as to be spaced from said at least one diffused resistor.

4. The method of claim 3 in which the substrate is N-type semiconductor material.

5. The method of claim 3 in which the substrate is P-type semiconductor material.

6. The method of claim 2 in which the substrate is N-type semiconductor material.

7. The method of claim 2 in which the substrate is P-type semiconductor material.

8. The method of claim 1 in which the substrate is N-type semiconductor material.

9. The method of claim 1 in which the substrate is P-type semiconductor material.

* * * * *

UNITED STATES PATENT AND TRADEMARK OFFICE
CERTIFICATE OF CORRECTION

PATENT NO. : 5,316,964
DATED : May 31, 1994
INVENTOR(S) : Gross

Page 1 of 2

It is certified that error appears in the above-indentified patent and that said Letters Patent is hereby corrected as shown below:

The drawing sheet, consisting of Fig. 2, should be deleted to be replaced with the drawing sheet, consisting of Fig. 2, as shown on the attached page.

Signed and Sealed this

Thirteenth Day of December, 1994

Attest:

BRUCE LEHMAN

*Attesting Officer*    Commissioner of Patents and Trademarks